United States Patent [19]

Kataoka

[11] Patent Number: 5,631,762
[45] Date of Patent: May 20, 1997

[54] MULTI-BEAM GENERATING ELEMENT AND OPTICAL PRINTING APPARATUS THEREWITH

[75] Inventor: Keiji Kataoka, Katsuta, Japan

[73] Assignee: Hitachi Koki Co., Ltd., Tokyo, Japan

[21] Appl. No.: 250,579

[22] Filed: May 27, 1994

[30] Foreign Application Priority Data

Jun. 4, 1993 [JP] Japan ................................ 5-134836
Jul. 29, 1993 [JP] Japan ................................ 5-188408

[51] Int. Cl.$^6$ ........................... G02B 26/08; G02B 5/18
[52] U.S. Cl. ..................... 359/204; 359/569; 359/575; 347/233; 347/238
[58] Field of Search ......................... 359/569, 575, 359/558, 565, 566, 571, 574, 204; 347/233, 238

[56] References Cited

U.S. PATENT DOCUMENTS

| | | | |
|---|---|---|---|
| 4,125,864 | 11/1978 | Aughton ............................ | 358/298 |
| 4,198,701 | 4/1980 | Redderson et al. .................. | 365/127 |
| 4,459,690 | 7/1984 | Corsover et al. ................... | 369/44.38 |
| 4,626,069 | 12/1986 | Dammann et al. ................... | 359/569 |
| 5,017,000 | 5/1991 | Cohen ............................. | 359/571 |
| 5,113,286 | 5/1992 | Morrison .......................... | 359/569 |
| 5,124,843 | 6/1992 | Leger et al. ...................... | 359/569 |
| 5,144,483 | 9/1992 | Cohen ............................. | 359/565 |
| 5,162,943 | 11/1992 | Komatsu et al. .................... | 359/569 |
| 5,195,103 | 3/1993 | Hinton et al. ..................... | 372/26 |
| 5,389,959 | 2/1995 | Haas .............................. | 347/187 |
| 5,422,753 | 6/1995 | Harris ............................ | 359/569 |
| 5,430,546 | 7/1995 | Huber ............................. | 359/569 |
| 5,477,383 | 12/1995 | Jain .............................. | 359/565 |

FOREIGN PATENT DOCUMENTS

| | | | |
|---|---|---|---|
| 0386643 | 9/1990 | European Pat. Off. ............... | 359/569 |
| 4007968 | 9/1991 | Germany ........................... | G01B 11/00 |

OTHER PUBLICATIONS

McCormick, "Generation of Large Spot Arrays from a Single Laser Beam by Multiple-Imaging with Binary Phase Gratings" Optical Engineering, vol. 28, No. 4, Apr. 1989.

H. Dammann and K. Görtler, "High-Efficiency In-Line Multiple Imaging by Means of Multiple Phase Holograms" Optics Communications, vol. 3, No. 5 Jul. 1971.

J. Jahns, et al., "Dammann Gratings for Laser Beam Shaping", Optical Engineering, vol. 28, No. 12, Dec. 1989.

Southall, *Mirrors, Prisms, and Lenses*, MacMillan Company, New York, pp. 583–584, Dec. 1923.

Primary Examiner—Thong Nguyen
Assistant Examiner—John Juba, Jr.
Attorney, Agent, or Firm—Antonelli, Terry, Stout & Kraus, LLP

[57] ABSTRACT

A multi-beam generating element generates an even number of multiple beams having a uniform light intensity. The multi-beam generating element has a grating constructed by repeatedly arranging basic phase patterns, wherein the basic patterns are composed of at least two kinds of rectangular patterns having non-uniform widths and different phase heights. The basic phase patterns are fabricated by superposing rectangular patterns having non-uniform widths and single phase heights to form a multi-layer arrangement. In an optical printing apparatus having the grating, the multiple beams coming out of a multi-beam generating element are applied to a multi-channel acousto-optical element, a Dove prism rotating the angle of the aligned direction of the multiple beams having light intensities which have been modulated, and then the beams are scanned with a rotating polygonal mirror. By employing a grating generating multiple beams having uniformity in light intensities, a high speed and high resolution optical printing apparatus can be attained.

7 Claims, 9 Drawing Sheets

MULTI-BEAM GENERATING ELEMENT AND OPTICAL PRINTING APPARATUS THEREWITH

BACKGROUND OF THE INVENTION

The present invention relates to a multi-beam generating element and an optical printing apparatus to be used therewith, and more particularly to a multi-beam generating element and an optical printing apparatus which a laser beam is branched into a plurality of beams, which are processed in parallel to realize a high speed processing.

A laser beam incident upon a grating element is branched into multiple diffracted light beams. There have been a lot of proposals which use this phenomenon is as a multi-beam generating element, and there have been some applications developed as well. However, it has been difficult to increase the number of branched beams and to efficiently make the intensity distribution of the branched beams uniform.

As a countermeasure against this problem, a method which uses a grating element for converting a single beam into multiple beams has been proposed in Technical Digest on The 3rd Microoptics Conference, page 84 (1991). The method, however, includes a complicated fabricating process where the intensity of an electron beam needs to be accurately controlled using many intensity levels to irradiate a material to be exposed by the electron beam since the material is formed to have a multi-level phase pattern. Further, there are limitations in the number of the branched beams, the efficiency of light utilization and the uniformity in the light intensity distribution of the branched beams, since the number of levels in the multi-level phase pattern is limited due to a limitation in the fabrication process.

The inventors have proposed a grating element for converting a single beam into multiple beams where the basic phase patterns composing the grating are formed in fractionized rectangular patterns having non-uniform widths and have the phase height of a single level. In this method, by optimizing and determining the non-uniform widths in the rectangular patterns, it is possible to obtain an odd number of multiple beams having an excellent uniformity and a high efficiency of light utilization. The grating according to this method can be easily fabricated, since the pattern is formed of a single layer coating material.

The method according to the above invention, however, cannot generate an even number of multiple beams. A electronic control circuit used together with an optical apparatus is constructed on the basis of information composed of 1 byte or 8 bits, that is, an even number. Further, a flip-flop circuit and/or a counter circuit frequently used in a control circuit have a basic operation for converting the number of electric pulse signals into twice or a half as many as the original electric pulse signals. For these reasons, it is frequently required that the number of multiple beams used in an optical apparatus is an even number.

On the other hand, it is well known that scanning by use of a plurality of laser beams is an effective method for a high speed laser printer. For example, in a laser printer which the inventors have proposed, a plurality of laser beams generated by a grating are converted into parallel multiple beams using a lens and are inputted to a multi-channel acousto-optical modulator. Then, a plurality of the laser beams modulated by the multi-channel acousto-optical modulator are scanned on a photosensitive drum using a rotating polygonal mirror.

To form a beam spot array at an oblique angle on the photosensitive drum in the optical system described above, the grating and the multi-channel acousto-optical modulator need to be accurately adjusted so as to have a tilt at a given angle to a horizontal plane. It is theoretically possible to adjust the two units together, but practically it has been extremely difficult. Especially for the multi-channel acousto-optical modulator, in order to efficiently diffract the primary degree diffracted beam among all of the incident multiple beams, the angle adjustment in the plane diffracting the beams, that is, the adjustment in that Bragg angle, requires an extremely high accuracy. In addition to this, it has been very difficult to effect an adjustment to form the beam spot array an oblique angle on the photosensitive drum.

SUMMARY OF THE INVENTION

An object of the present invention is to provide a multi-beam generating element which generates an even number of multiple beams and has a high and uniform efficiency of light utilization, and to provide a high speed and high resolution optical printing apparatus using the multi-beam generating element.

Another object of the present invention is to provide an optical printing apparatus having a light scanning unit for scanning multiple laser beams using an acousto-optical modulator, wherein it is possible to perform the necessary angle adjustments of the light spot array formed by the multiple beams on a scanning medium member to the scanning direction easily and accurately.

The objects of the present invention can be attained by providing a multi-beam generating element having basic phase patterns repeatedly arranged, wherein the basic patterns are composed of at least two kinds of rectangular patterns having non-uniform widths and different phase heights, which generates multiple beams having practically equal light intensities, and especially the basic phase patterns are asymmetrical patterns not having symmetric axes. Therewith, it is possible to generate an even number of multiple beams having a high efficiency of light utilization and a uniform light intensity.

A multi-beam generating element, that is, a grating having the basic phase patterns described above can be fabricated by superposing a plurality of phase patterns. On this occasion, the phase patterns to be superposed have different phase heights with respect to each other, but each of the phase patterns is a rectangular pattern having a single phase height and a non-uniform width.

As described above, since the multi-beam element according to the present invention can be fabricated by repeatedly performing the process for forming patterns composed of rectangular shapes on a optical material having a constant film thickness, it can be easily fabricated. In addition to this, by freely designing the widths in the rectangular patterns, it is possible to generate an even number of multiple beams having a high efficiency of light utilization and a uniform light intensity.

Further, the objects of the present invention can be attained by using the generated multiple beams together with a multi-channel acousto-optical modulator. Therewith, a high speed and high resolution optical printing apparatus can be realized.

Furthermore, the objects of the present, invention can be attained by properly rotating a Dove prism using a Dove prism rotating mechanism. Therewith, a light spot array can be formed on a scanning medium member with an arbitrary angle against the scanning direction. Therefore, the angle setting can be easily and accurately performed. In other words, since a Dove prism is placed between a multi-channel acousto-optical modulator and a rotating polygonal mirror, the diffraction efficiency of the acousto-optical modulator can be kept at a high level, and a light spot array can be easily and accurately formed on a scanning medium member with an arbitrary angle against the scanning direction without affecting the high diffraction efficiency of the acousto-optical modulator. Therefore, it is possible to obtain an optical printing apparatus in which the pitch of the scanning lines is always kept constant.

DETAILED DESCRIPTION OF THE PREFERRED EMBODIMENTS

Figure 1:
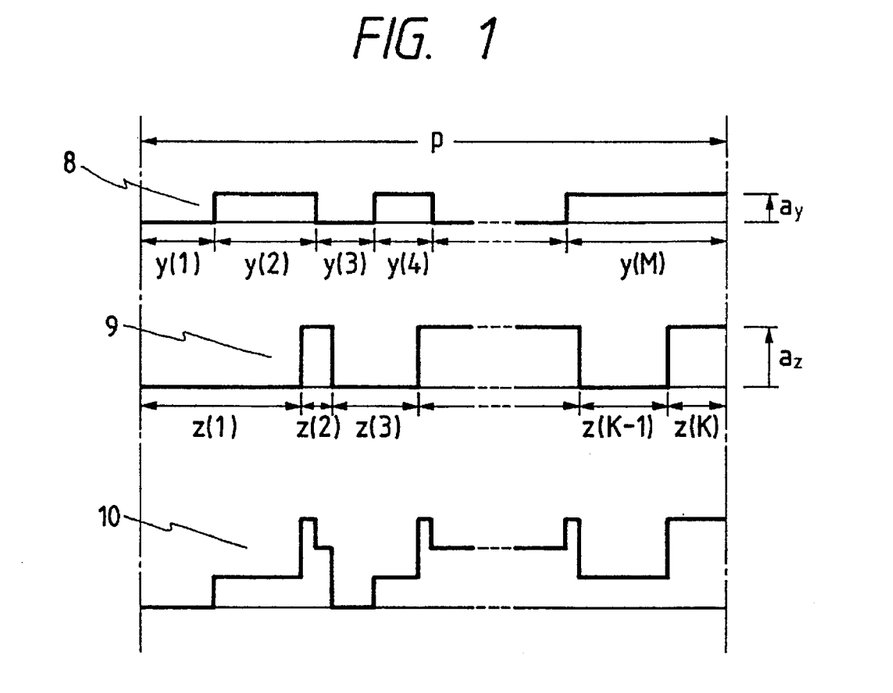
FIG. 1 is a view of one embodiment of a basic phase pattern for a grating used in a multi-beam generating element in accordance with the present invention.

The present invention will be described in detail below, referring to FIG. 1.

In a grating, basic phase patterns are repeatedly arranged with a pitch p. The basic phase pattern 10 according to the present invention is constructed by superposing phase patterns 8 and 9, each of the phase patterns 8 and 9 having a rectangular pattern with a single phase height and non-uniform widths. In this embodiment, the phase pattern 8 is composed of M sections of rectangular patterns which have non-uniform widths of y(l) to y(M). The phase height of the phase pattern 8 is ay. On the other hand, the phase pattern 9 is also composed of K sections of rectangular patterns which have non-uniform widths of z(l) to z(K). The phase height of the phase pattern 9 is az.

Figure 2:
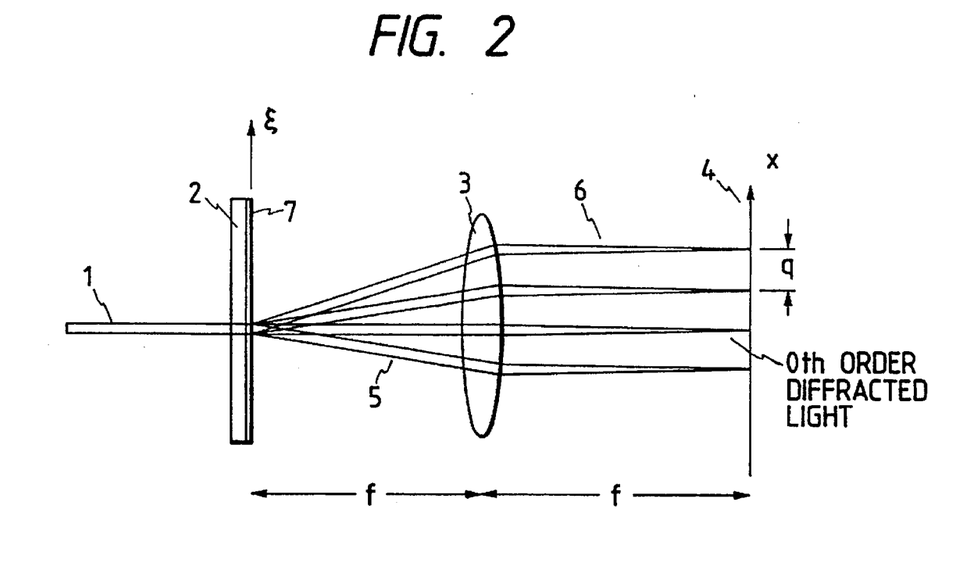
FIG. 2 is a schematic view of an optical system for generating multiple beams using a grating.

FIG. 2 shows an of an optical system for generating an even number of beams such as four beams using a grating 7. A lens 3 is placed such that the position of the grating 7 comes at the front focus point of the lens 3 and the position of the image formation plane 4 comes at the rear focus point of the lens. An incident laser beam 1 to the grating 7, designed as a four beam generator, generates four beams 6 consisting of minus (−) primary order diffracted light, 0th order diffracted light, primary order diffracted light and secondary order diffracted light so that the generated even number of four beams are asymmetrical in regard to the 0th order beam. The aligned pitch q of the four beams 6 on the image formation plane 4 is constant. By generating diffracted light beams asymmetrically, as shown in the figure, an even number of beams can be generated. In a case where a basic phase pattern is formed of a phase pattern of a single layer, as shown by the numeral 8 in FIG. 1, no suitable asymmetric diffracted pattern can be obtained, and an even number of multiple beams having more than four beams cannot be produced.

The design procedure will be described in detail below.

Putting the basic phase pattern as $f(\xi)$ and the lattice pitch of the grating as p, the light intensity distribution on a screen shown by the numeral 4 in FIG. 2 is expressed as the following Equation (1):

$$I(s) = \left| \int_{-\infty}^{\infty} \sum_{m=0}^{N-1} f(\xi - mp) \exp(-i\xi s) d\xi \right|^2 \quad (1)$$

where s is a normalized coordinate on the screen 4, and is expressed as $s = 2\pi x/(\pi f)$. Here, $\pi$ is the wave length of incident light, and N is the total number of basic phase patterns contained in the grating 7. By calculating Equation (1), the following Equation (2) is obtained:

$$I(s) = F(s)M(s) \quad (2)$$

where $$F(s) = \left| \int_{-\infty}^{\infty} f(\xi) \exp(-i\xi s) d\xi \right|^2 \quad (3)$$

$$M(s) = |\sin(psN/2)/\sin(ps/2)|^2 \quad (4)$$

Figure 3:
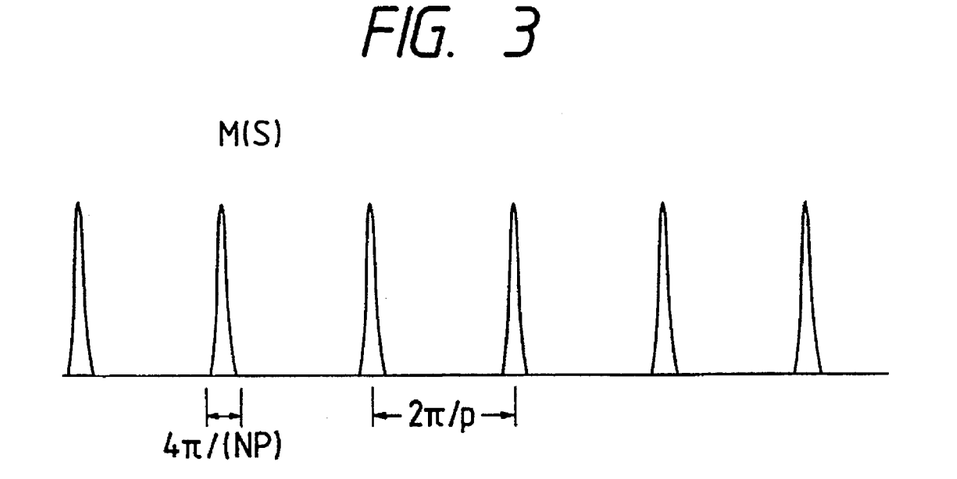
FIG. 3 is a view explaining the function M(s).

The function M(s) in Equation (4) is a function having the same peak values at the diffraction position on the grating 7 as shown in FIG. 3. In order to obtain the multiple diffracted beams from the grating 7 having the same light intensity, the function F(s) in Equation (3) needs to have the same value for the multiple diffracted beams. For doing so, it is important how the function $f(\xi)$ expressing the basic phase pattern is determined.

An embodiment of a design obtained through calculating Equation (3) for the basic phase pattern according to the present invention will be described below. Incidentally, the value of Equation (3) does not change whether the phase height ay or az is taken as a positive or negative value. And, it is also obvious that the value of Equation (3) does not change when an integer times of $2\pi$ is added to the phase height.

(1) Concerning a two beam element, the relations expressed by Equation (5) are obtained.

$$y(1)/p=0.347,$$
$$y(2)/p=0.653,$$
$$z(1)/p=0.653,$$
$$z(2)/p=0.347,$$
$$ay=1.12 \text{ (radian)},$$
$$az=1.12 \text{ (radian)}. \quad (5)$$

Figure 4:
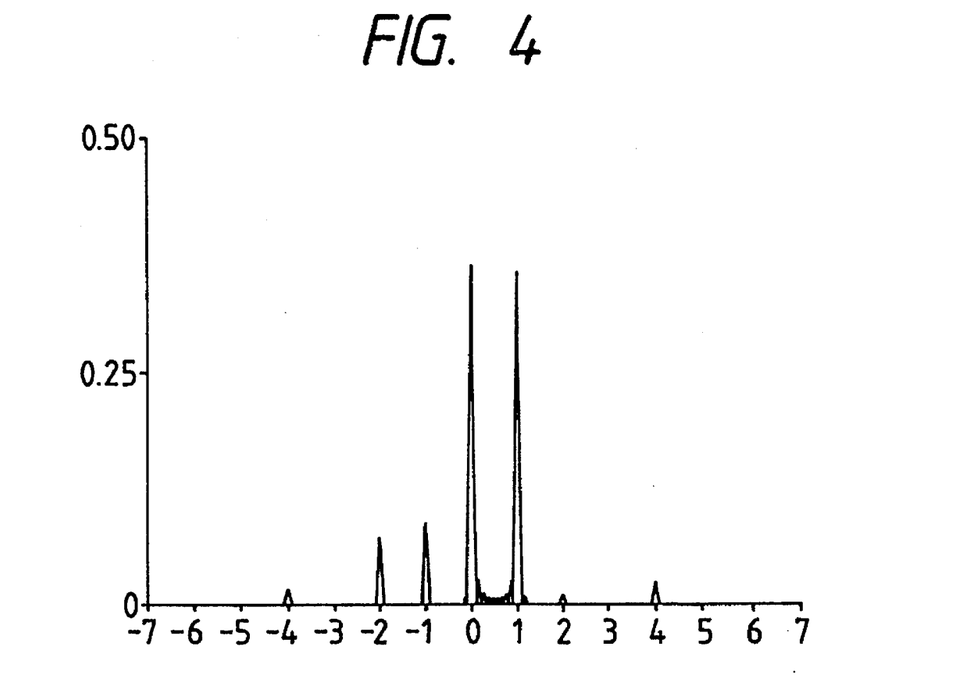
FIG. 4 shows an example of a calculation result for a case where two beams are generated using a multi-beam generating grating in accordance with the present invention.

FIG. 4 shows a simulation result reproduced by the element of this design example using the optical system in FIG. 2. The ordinate shows the light intensity, but normalized by the incident light intensity. The total light intensity of the two beams, zeroth order diffracted beam and primary order diffracted beam, is 75%. Providing that the uniformity of the two beams is allowable unless the difference between each beam intensity and the average light intensity exceeds 50%, the design values expressed by Equation (5) are allowable to the following ranges.

$$0.14<y(1)/p<0.87,$$
$$0.13<y(2)/p<0.86,$$
$$0.13<z(1)/p<0.86,$$
$$0.14<z(2)/p<0.87,$$
$$0.52<|ay|<1.7,$$
$$0.52<|az|<1.7. \quad (6)$$

(2) Concerning a four beam element, the relations expressed by Equation (7) are obtained.

$$y(1)/p=0.372,$$
$$y(2)/p=0.628,$$
$$z(1)/p=0.254,$$
$$z(2)/p=0.443,$$
$$z(3)/p=0.146,$$
$$z(4)/p=0.156,$$
$$ay=1.66,$$
$$az=1.13. \quad (7)$$

Figure 5:
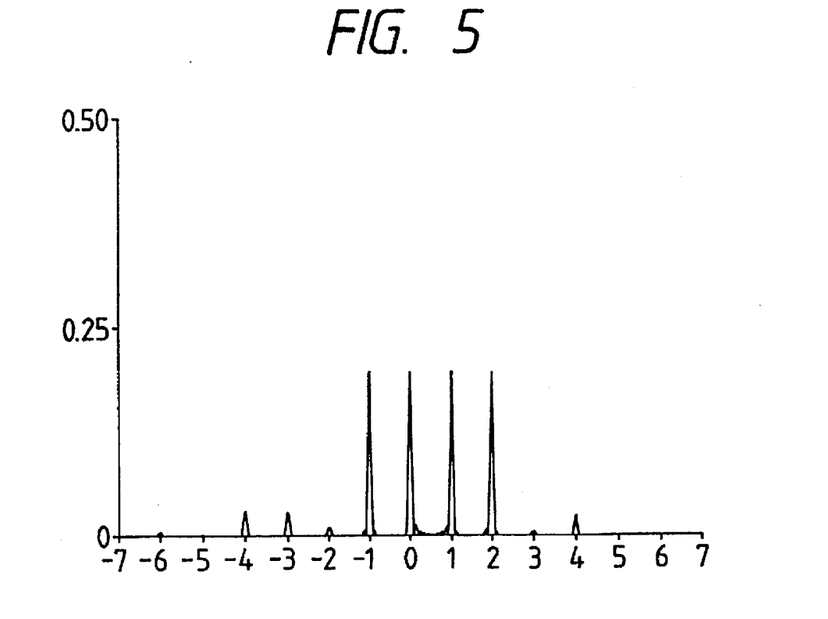
FIG. 5 shows an example of a calculation result for a case where four beams are generated using a multi-beam generating grating in accordance with the present invention.

FIG. 5 shows a simulation result reproduced by the element of this design example using the optical system in FIG. 2. The ordinate shows the light intensity, but normalized by the incident light intensity. Four beams are represented by the –primary order diffracted beam, the zeroth order diffracted beam, the +primary order diffracted beam and the +secondary order diffracted beam. As is apparent, the four beams are asymmetrical in regard to the zeroth order diffracted beam. The total light intensity of the four beams is 80%, and therefore the light utilization is high. Providing that the uniformity of the multiple beams is allowable unless the difference between each beam intensity and the average light intensity exceeds 50%, the design values expressed by Equation (7) are allowable to the following ranges expressed by Equation (8).

$$0.254<y(1)/p<0.475,$$
$$0.477<y(2)/p<0.76,$$
$$0.167<z(1)/p<0.34,$$
$$0.264<z(2)/p<0.554,$$
$$0.046<z(3)/p<0.28,$$
$$0.105<z(4)/p<0.23,$$
$$1.34<|ay|<2.12,$$
$$0.67<|az|<1.59. \quad (8)$$

Figure 6:
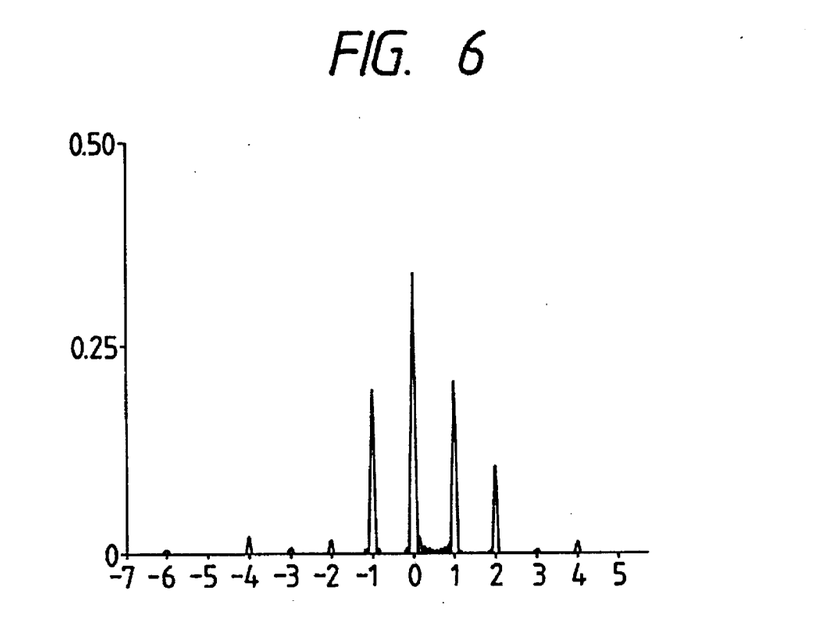
FIG. 6 shows a calculated result for a case where four beams are generated.

FIG. 6 shows a simulation result of diffraction beams when the phase $az=1.13$ in Equation (7) is replaced by $az=0.6$. The uniformity of the four beams generated is deteriorated.

The uniformity of multiple beams will be explained below, referring to FIG. 7.
light intensity of
–primary order diffracted beam: 0.2026
zeroth order diffracted beam: 0.3408
+primary order diffracted beam: 0.2117
+secondary order diffracted beam: 0.1078
the average light intensity of these beams is 0.2157.
The uniformity is defined by the following equation.

uniformity=(maximum difference from average beam intensity)÷(average beam intensity)×100.

Figure 7:
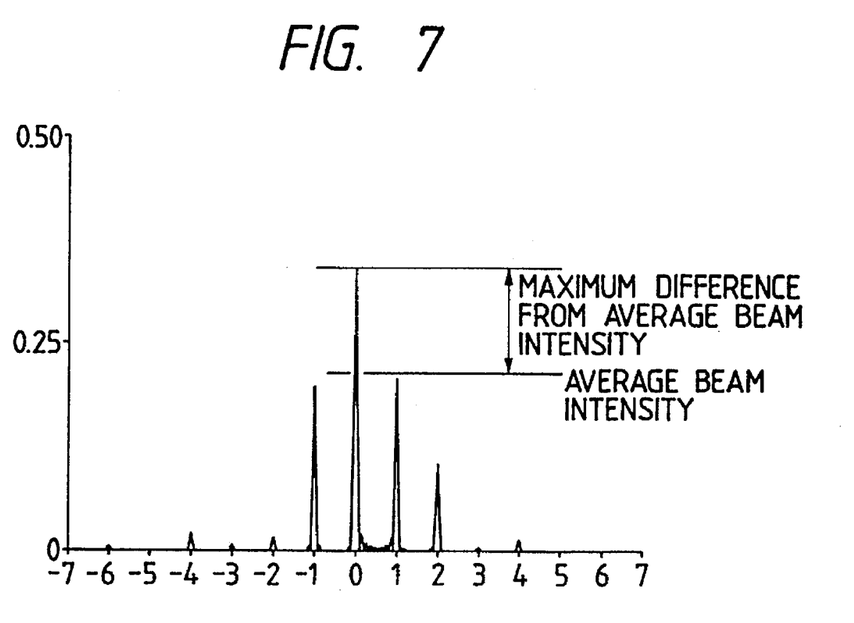
FIG. 7 is a view explaining the uniformity in multiple beams.

In the case of FIG. 7, the uniformity is $$0.1251 \div 0.2157 \times 100 = 58.0.$$

The design value in a present invention can allow the uniformity $\leq 50\%$. When the uniformity $>50\%$ as shown in FIG. 7, unevenness arises among the beams, resulting in the printing becoming non-uniform.

(3) Concerning a six beam element, the relations expressed by Equation (9) are obtained.

$$y(1)/p=0.080,$$
$$y(2)/p=0.059,$$
$$y(3)/p=0.297,$$
$$y(4)/p=0.565,$$
$$z(1)/p=0.37,$$
$$z(2)/p=0.255,$$
$$z(3)/p=0.197,$$
$$z(4)/p=0.178,$$
$$ay=1.344,$$
$$az=1.68. \quad (9)$$

Figure 8:
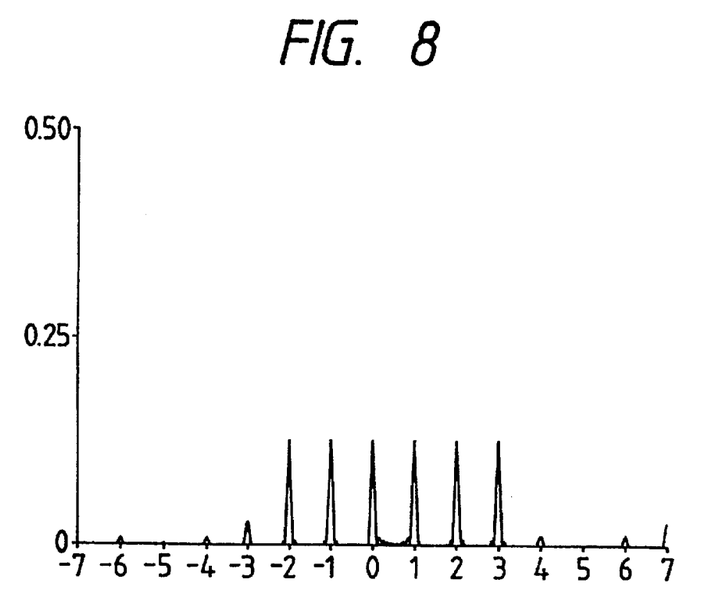
FIG. 8 shows an example of a calculation result for a case where six beams are generated using a multi-beam generating grating in accordance with the present invention.

FIG. 8 shows a simulation result reproduced by the element of this design example using the optical system in FIG. 2. The ordinate shows the light intensity, but normalized by the incident light intensity. Six beams are represented by the–secondary order diffracted beam, the–primary order diffracted beam, beam zeroth order diffracted beam, beam+primary order diffracted beam, the+secondary order diffracted beam and the+third order diffraction beam. The total light intensity of the six beams is 77%, and therefore the light utilization is high. Providing that the uniformity of the multiple beams is allowable unless the difference between each beam intensity and the average light intensity exceeds 50%, the design values expressed by Equation (9) are allowable to the following ranges expressed by Equation (10).

$$y(1)/p<0.159,$$

$$y(2)/p<0.133,$$

$$0.212<y(3)/p<0.368,$$

$$0.504<y(4)/p<0.613,$$

$$0.313<z(1)/p<0.447,$$

$$0.180<z(2)/p<0.317,$$

$$0.142<z(3)/p<0.271,$$

$$0.148<z(4)/p<0.218,$$

$$1.05<|ay|<1.71,$$

$$1.44<|az|<1.97. \quad (10)$$

(4) Concerning an eight beam element, the relations expressed by Equation (11) are obtained.

$$y(1)/p=0.297,$$

$$y(2)/p=0.143,$$

$$y(3)/p=0.174,$$

$$y(4)/p=0.179,$$

$$y(5)/p=0.075,$$

$$y(6)/p=0.132,$$

$$z(1)/p=0.306,$$

$$z(2)/p=0.155,$$

$$z(3)/p=0.121,$$

$$z(4)/p=0.418,$$

$$ay=1.360,$$

$$az=1.37. \quad (11)$$

Figure 9:
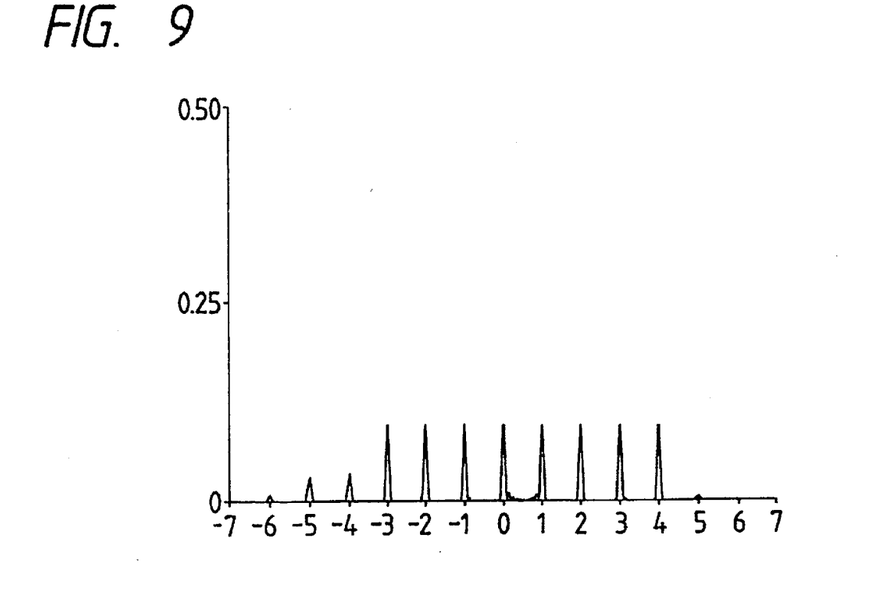
FIG. 9 shows an example of a calculation result for a case where eight beams are generated using a multi-beam generating grating in accordance with the present invention.

FIG. 9 shows a simulation result reproduced by the element of this design example using the optical system in FIG. 2. The ordinate shows the light intensity, but normalized by the incident light intensity. Eight beams are represented by the −third order diffracted beam, the −secondary order diffracted beam, the −primary order diffracted beam, the zeroth order diffracted beam, the +primary order diffracted beam, the +secondary order diffracted beam, the+third order diffraction beam and the+fourth order diffracted beam. The total light intensity of the eight beams is 79%, and therefore the light utilization is high. Providing that the uniformity of the multiple beams is allowable unless the difference between the each beam intensity and the average light intensity exceeds 50%, the design values expressed by Equation (11) are allowable to the following ranges expressed by Equation (12).

$$0.233<y(1)/p<0.359,$$

$$0.086<y(2)/p<0.242,$$

$$0.086<y(3)/p<0.229,$$

$$0.101<y(4)/p<0.240,$$

$$0.015<y(5)/p<0.149,$$

$$0.098<y(6)/p<0.178,$$

$$0.236<z(1)/p<0.365,$$

$$0.071<z(2)/p<0.222,$$

$$0.059<z(3)/p<0.183,$$

$$0.380<z(4)/p<0.453,$$

$$1.181<|ay|<1.583,$$

$$1.191<|az|<1.59. \quad (12)$$

Figure 10A:
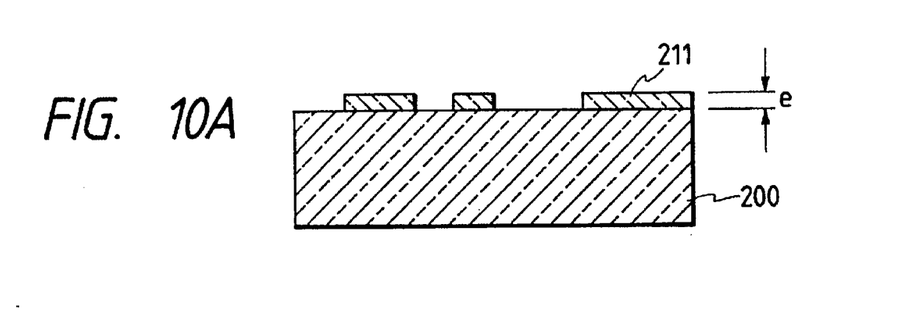
FIGS. 10A–10C are views explaining the method of fabricating a multi-beam generating element and illustrating the cross-sectional structure of a multi-beam generating element in accordance with the present invention.
Figure 10B:
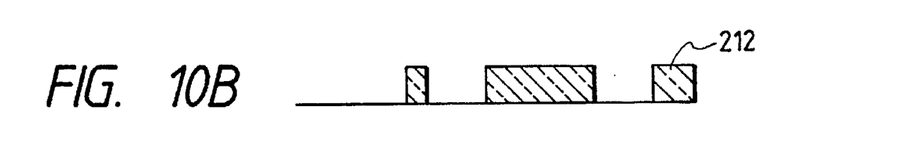
Figure 10C:
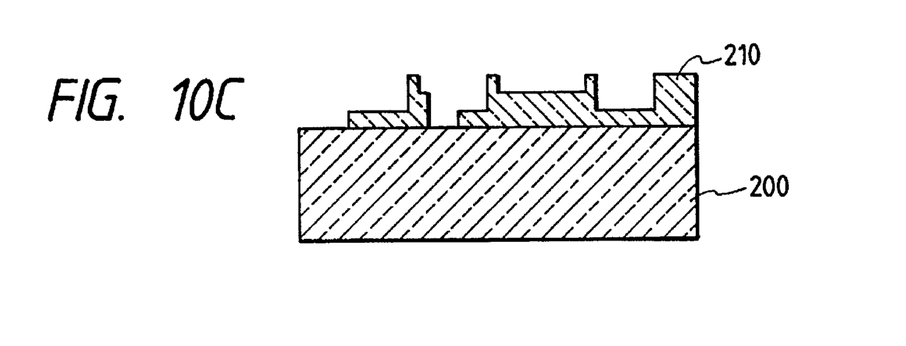

The grating element for generating multi-beams according to the present invention can be easily fabricated through use of conventional coating technology and etching technology for optical materials. That is, in order to fabricate, for example, the phase pattern indicated by the numeral 10 in FIG. 1, firstly a pattern 211 made of optical material having a given film thickness is formed (refer to FIG. 10A). Next, on the pattern, a pattern 212 made of optical material having a given film thickness is additively formed so that the phase pattern 9 in FIG. 1 is formed (refer to FIG. 10B). As a result, the element 210 obtained in FIG. 10C has the phase pattern 10 in FIG. 1. As described above, the construction of the grating according to the present invention may be formed by superposing each of the patterns having a given film thickness made of optical material, the number of which corresponds to the number of layers.

The film thickness of optical material e can be easily determined from the phase height a and the following equation.

$$a=(2\pi/\lambda)(n-1)e$$

A glass material may be used as a substrate 200, and $SiO_2$ or $MgF_2$ may be used as a coating material.

Figure 11:
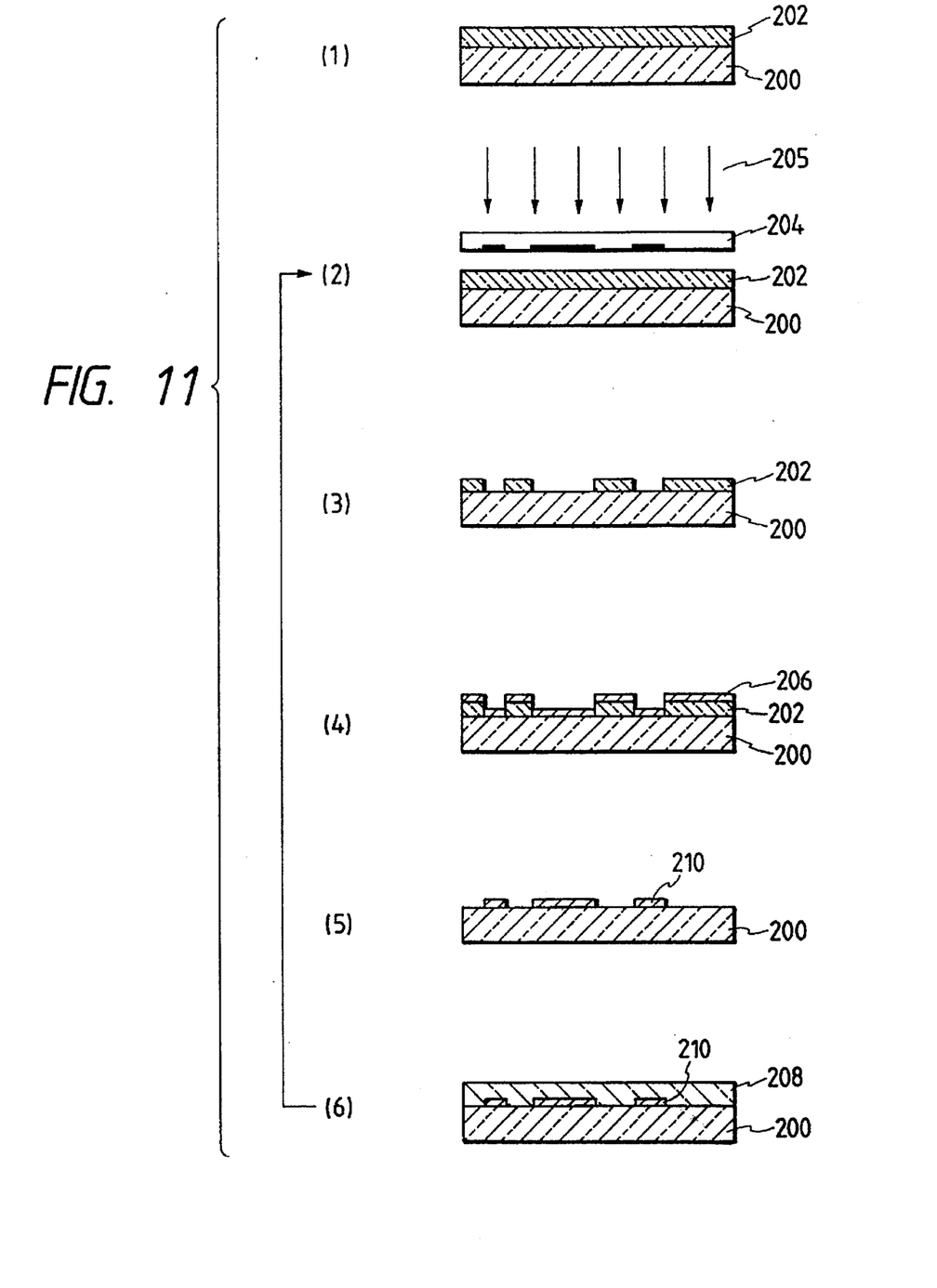
FIG. 11 is a view showing an embodiment of a fabricating process of a multi-beam generating element in accordance with the present invention.

FIG. 11 shows a detailed process of fabricating the grating according to the present invention. Firstly, in process (1), photoresist 202 is applied to a glass substrate 200. In process (2), a photo-mask 204 having a pattern made of chromium (Cr) is contacted to the photoresist 202 on the glass substrate, and the photoresist 202 is exposed with an exposing light 205. Then, in process (3), the photoresist is developed. Therewith, the pattern of the photo-mask 204 is transferred to the photoresist 202. In process (4), $SiO_2$ 206 is deposited all over the surface. The thickness of the deposited film is adjusted so as to become equal to the phase height. Process (5) is called "lift-off", where the photoresist 202 is solved with organic solvent, such as alcohol, to form an $SiO_2$ pattern 210. In a case where there is a need to form another $SiO_2$ pattern having a different thickness, photoresist 208 is applied again on the $SiO_2$ pattern in process (6). Returning to process (2) wherein the photoresist is exposed using another photo-mask, the same processes described above are repeated as many times as necessary.

Figure 12A:
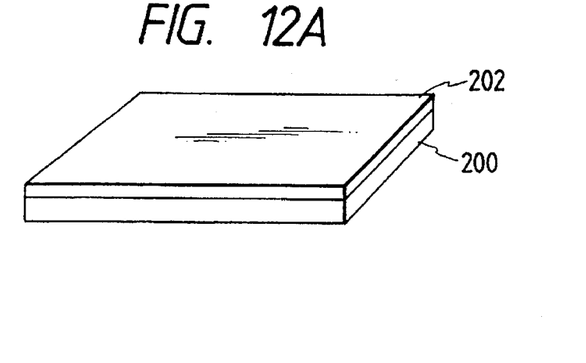
FIGS. 12A and 12B are views showing another embodiment of a fabricating process of a multi-beam generating element in accordance with the present invention.
Figure 12B:
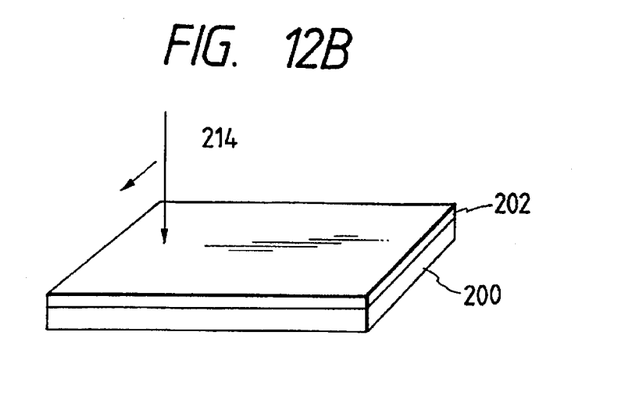

FIGS. 12A and 12B show an another method of fabricating the grating according to the present invention using an electron beam. In process (1) (FIG 12A), photoresist 202 is applied to a glass substrate 200 as seen in FIG 12A. In process (2) (FIG. 12B), the photoresist 202 is irradiated by an electron beam 214 as seen in FIG. 12B. The intensity of the electron beam 214 is varied and the incident position of the electron beam is scanned in the direction indicated by the arrow and the direction perpendicular to the arrow. Then, the photoresist irradiated by the electron beam is developed to form a resist pattern having different depths depending on the intensities of the irradiated electron beam. The produced pattern, as it is, may be used as a multi-beam generating element. On the other hand, a multi-beam generating element may be fabricated from a material, such as plastic, through a replicating process using the multi-beam generating element produced with the process shown in FIG. 11 or FIGS. 12A–12B as a master.

Figure 13:
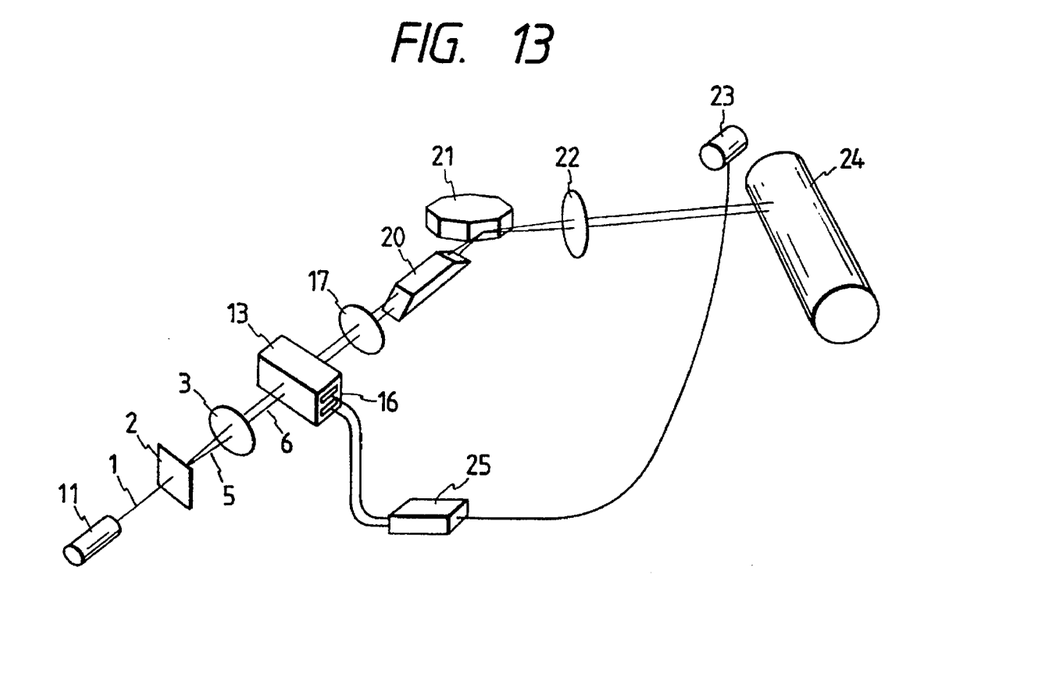
FIG. 13 is a view showing an optical printing apparatus using a multi-beam generating element.

FIG. 13 shows an embodiment of a laser printing apparatus which performs optical printing by using the multi-beam generating element according to the present invention. According to the apparatus, since optical printing is performed with multiple beams at the same time, it is possible to realize a laser printing apparatus having a high speed or a high resolution. A laser beam 1 emitted from a laser unit 11 is directed to a multi-beam generating element 2. A lens 3, as described with reference to FIG. 2, has the functions of converting generated multiple beams 5 into parallel beams 6 and of converging each of the beams into a small spot inside a multi-channel acousto-optical element 13. The time duration of passing an ultrasonic wave through the small spot can be shortened since each of the beams is converged into a small spot inside the multi-channel acousto-optical element 13, which leads to the capability of high speed light modulation.

Figure 14:
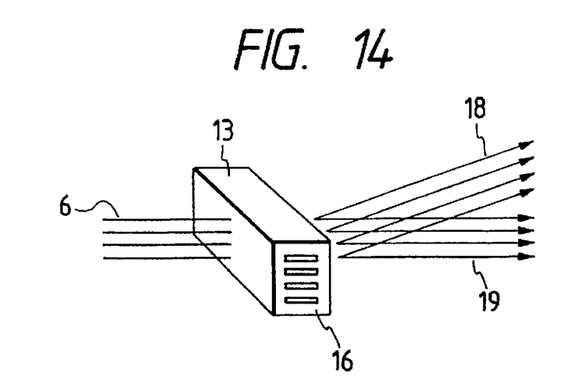
FIG. 14 is a view explaining the operation of a multi-channel acousto-optical modulator.

The outline of operation of the multi-channel acousto-optical element 13 will be described below, referring to FIG. 14. A plurality of transducers 16 are placed on an acousto-optical medium, such as, $PbMoO_4$ or $TeO_2$ crystal, individually to modulate each of plural incident beams 16. In other words, each of independent electric signals is supplied to each of the plural transducers 16, each of the transducers corresponding to a respective one of the signals independently transmitting a sonic beam in the crystal, the corresponding light beam being diffracted by the sonic beam and modulated. The numeral 18 in FIG. 14 indicates the modulated light beam to be utilized for optical printing. The numeral 19 indicates penetrated light beams which are intercepted at a proper position not to reach a optical printing material.

Now returning to FIG. 13, the numeral 25 indicates a circuit unit for driving the multi-channel acousto-optical apparatus 13. The light coming out from the multi-channel acousto-optical element 13 is converted with a lens 17 to a beam having a suitable diameter, passing through a Dove prism 20, and entering to a rotating polygonal mirror 21. The rotating polygonal mirror 21 is rotated to scan the multiple beams on a photosensitive drum 24 at one time. A lens 22 converges the multiple light beams to plural fine spots on the photosensitive drum 24.

Figure 15:
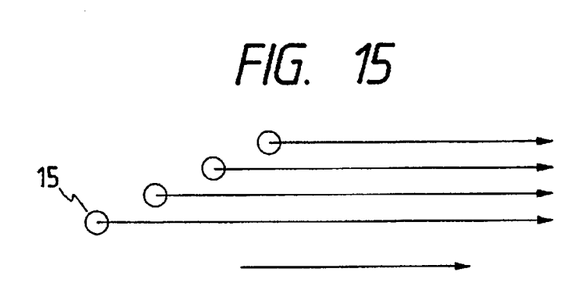
FIG. 15 is a view showing an appearance of multiple spot scanning.

Here, the multiple light beams are converged as a row of small spots in the multi-channel acousto-optical element 13. Providing the diameter of the spots is D, the aligned pitch of the transducers 16 being T, T/D is larger than 1 (one). Therefore, the multiple spots on the photosensitive drum 24 are aligned in this ratio, that is, the aligned pitch of the spots becomes larger than the diameter of the spots. In order to eliminate the region between the scanning lines of the multiple spots not to be irradiated by the light, the multiple spots 15 need to be set such that the aligned direction of the spots on the photosensitive drum 24 becomes in oblique angle against the scanning direction indicated by the arrow, as shown in FIG. 15.

Figure 16:
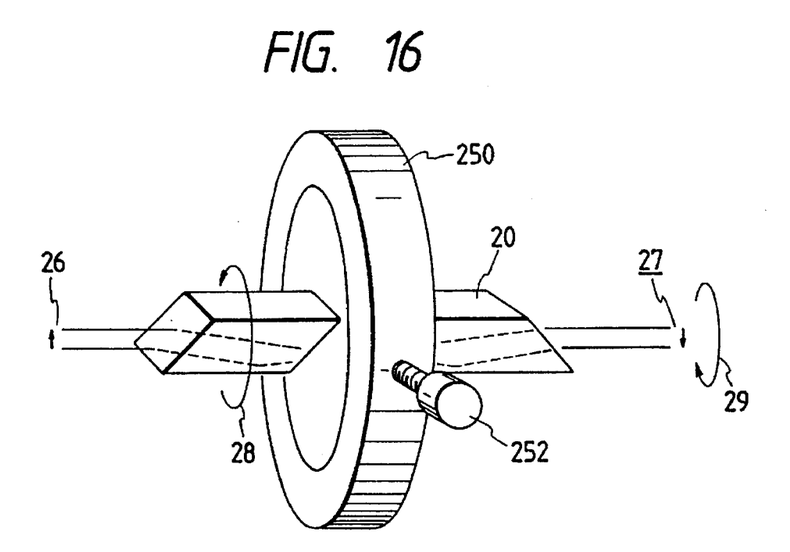
FIG. 16 is a view explaining the operation of a Dove prism.

Although there is a method to realize this where the optical axes of the multi-channel acousto-optical element 13 and the multi-beam generation element 2 are rotated at the same time, the method is extremely difficult to perform since the units to be rotated are large in size and a highly accurate incident position on the acousto-optical element 13 has to be kept. In order to avoid this difficulty, a Dove prism 20 is employed in the present invention. In this method, the Dove prism 20 is rotated around the optical axis as a rotating axis so as to be adjusted and set in a given aligned direction of the spots. As shown in FIG. 16, the image rotating mechanism of the Dove prism 20 has supporting hardware 250 and a fixing screw 252. The Dove prism 20 is rotated and adjusted to a suitable angle and fixed in angle using the fixing screw 252. That is, the light from an image 26 is totally reflected on the bottom surface inside the Dove prism 20 to be converted to an image 27. Therefore, when the Dove prism 20 is rotated in the direction shown by the arrow 28, the image is rotated in the direction shown by the arrow 29. A light detector 23 receives the multiple light beams, generating a signal corresponding to each of the beams to be used as a synchronizing signal for the corresponding light.

Figure 17:
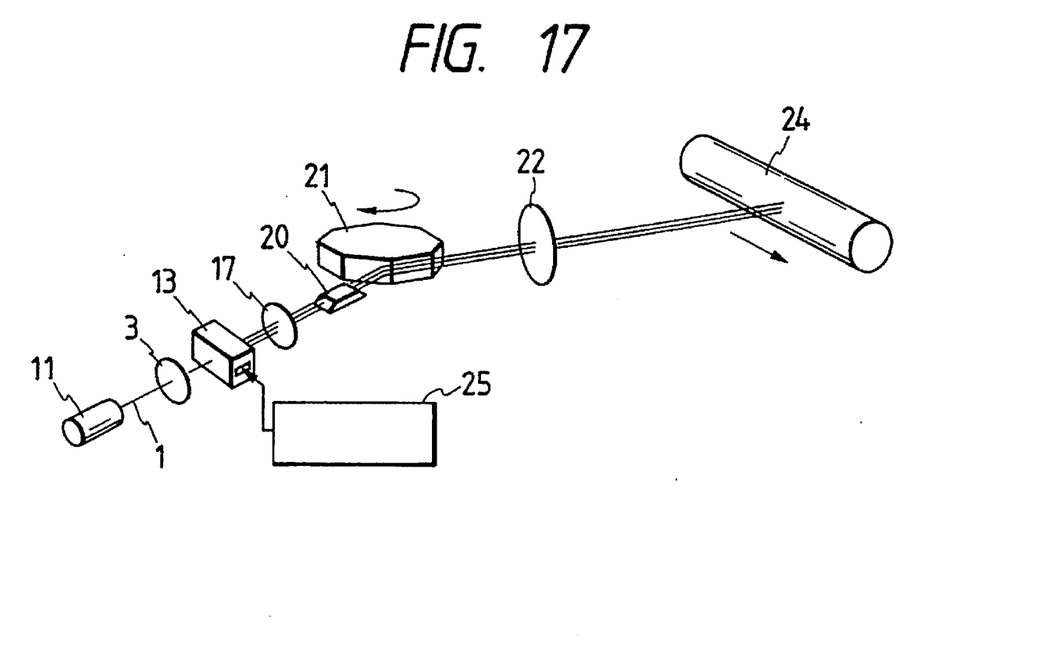
FIG. 17 is a schematic view showing anther embodiment of an optical printing apparatus in accordance with the present invention.

Another embodiment of the present invention will be described, referring to FIG. 17. FIG. 17 is a schematic view showing an embodiment where an optical printing apparatus is applied to a laser printer.

Figure 18:
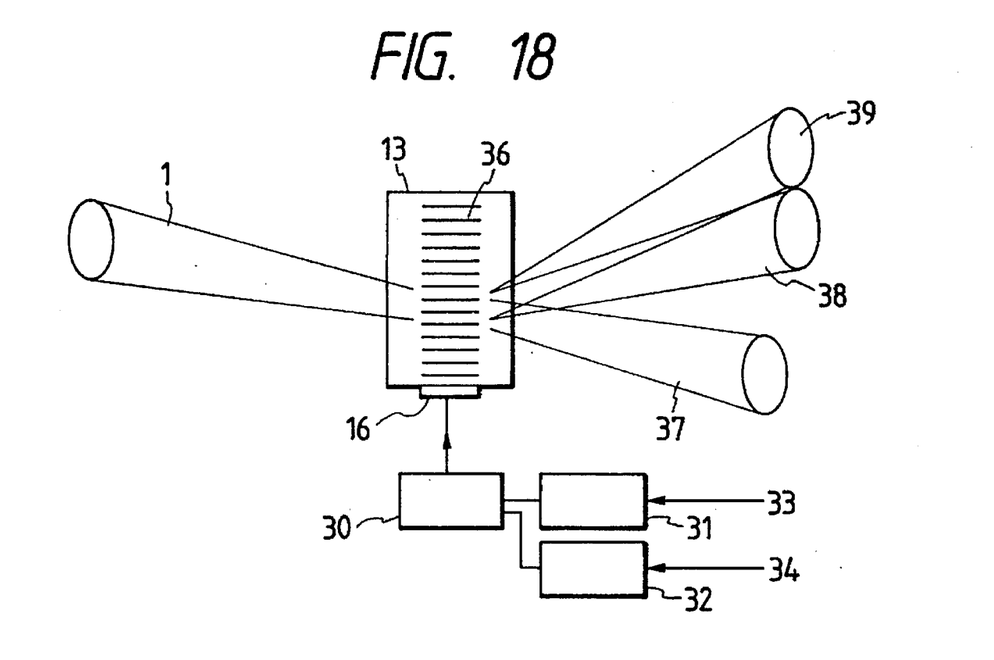
FIG. 18 is a view explaining the operation of an acousto-optical modulator.

In this embodiment, an acousto-optical modulator 13 has a single transducer. When a plurality of signals having carrier wave frequencies in the radio frequency band are applied to the modulator, a plurality of primary order diffraction light beams are generated, and a plurality of light spots can be formed and scanned on a photosensitive drum 24. FIG. 18 is a view explaining the operation of the acousto-optical modulator 13. For purposes of simplification, it is supposed that two beams are generated. The data 33 and the data 34 modulate carrier frequencies in elements 31 and 32, respectively, which modulated frequencies are combined with a composer 30 to be put into a transducer 16. When a laser beam 1 is entered to the acousto-optical modulator 13, two diffracted light beams 38, 39 are generated by an ultrasonic wave 36. In this method, by properly setting the frequencies of a plurality of carrier waves, the two diffracted light beams 38, 39 can be generated in close proximity to each other. Therefore, the light spot array scanning on the photosensitive drum 24 may be set perpendicular to the scanning direction. On this occasion, since the plural spots scan simultaneously at the same position in the scanning direction 10, there is an advantage in that the beams are modulated by data signals based on the same synchronized clock pulses. In this case, a Dove prism 20 is placed between a lens 5 and a rotating polygonal mirror 21. By rotating the Dove prism 20 using a Dove prism rotation adjusting mechanism shown in FIG. 16, the direction of spot alignment can be accurately set to be in perpendicular to the scanning direction.

I claim:

1. An optical printing apparatus comprising:

a multi-beam generating element for generating an even number of diffracted light beams asymmetrically in regard to a 0th order light beam and having a grating formed by a repetitious arrangement of basic phase patterns in a shape not having a symmetric relation;

a multi-channel optical modulator for modulating an intensity of the even number of light beams generated by said multi-beam generating element; and a light scanning unit for scanning the beams emitted from said multi-channel optical modulator on a photosensitive body.

2. An optical printing apparatus having the multi-beam generating element according to claim 1, wherein said basic phase patterns are are composed of at least two kinds of rectangular patterns having non-uniform widths and different phase heights.

3. An optical printing apparatus according to claim 2, wherein a multi-channel acousto-optical modulator is employed as the multi-channel optical modulator, and a Dove prism is provided between the multi-channel acousto-optical modulator and the light scanning unit.

4. An optical printing apparatus according to claim 1, wherein a multi-channel acousto-optical modulator is employed as the multi-channel optical modulator, and a Dove prism is provided between the multi-channel acousto-optical modulator and the light scanning unit.

5. An optical printing apparatus according to claim 1, wherein said multi-channel optical modulator is a multi-channel acousto-optical modulator.

6. An optical printing apparatus according to claim 1, wherein a Dove prism is provided between said multi-channel optical modulator and said light scanning unit.

7. An optical printing apparatus according to claim 1, wherein said light scanning unit includes a rotating polygonal mirror.

* * * * *